United States Patent
Lee et al.

(10) Patent No.: US 6,815,887 B2
(45) Date of Patent: Nov. 9, 2004

(54) ORGANIC ELECTROLUMINESCENT DISPLAY DEVICE

(75) Inventors: Joon-bae Lee, Yongin (KR); Chang-won Park, Suwon (KR); Jin-woo Park, Suwon (KR); Dong-chan Shin, Hwaseong (KR)

(73) Assignee: Samsung SDI Co., Ltd., Suwon-si (KR)

(*) Notice: Subject to any disclaimer, the term of this patent is extended or adjusted under 35 U.S.C. 154(b) by 0 days.

(21) Appl. No.: 10/098,477

(22) Filed: Mar. 18, 2002

(65) Prior Publication Data

US 2003/0117071 A1 Jun. 26, 2003

(30) Foreign Application Priority Data

Dec. 26, 2001 (KR) .......................... 2001-85101

(51) Int. Cl.[7] .............................. H01J 1/62; H05J 33/06
(52) U.S. Cl. .................... 313/512; 313/506; 313/504
(58) Field of Search .............................. 313/512, 504, 313/506–507, 509, 500–501

(56) References Cited

U.S. PATENT DOCUMENTS

| | | | |
|---|---|---|---|
| 5,047,687 A | 9/1991 | VanSlyke | 313/503 |
| 5,059,861 A | 10/1991 | Littman et al. | 313/503 |
| 5,073,446 A | 12/1991 | Scozzafava et al. | 428/323 |
| 5,488,266 A * | 1/1996 | Aoki et al. | 313/509 |
| 5,504,389 A | 4/1996 | Dickey | 313/506 |
| 5,684,365 A * | 11/1997 | Tang et al. | 315/169.3 |
| 5,990,615 A * | 11/1999 | Sakaguchi et al. | 313/504 |
| 6,023,073 A * | 2/2000 | Strite | 257/40 |
| 6,121,726 A * | 9/2000 | Codama et al. | 313/504 |
| 6,175,345 B1 * | 1/2001 | Kuribayashi et al. | 345/76 |
| 6,198,217 B1 * | 3/2001 | Suzuki et al. | 313/504 |
| 6,198,218 B1 * | 3/2001 | Kobashi et al. | 313/504 |
| 6,204,610 B1 * | 3/2001 | Komiya | 315/169.3 |
| 6,280,809 B1 * | 8/2001 | Wang et al. | 428/64.1 |
| 6,429,584 B2 * | 8/2002 | Kubota | 313/504 |
| 6,433,487 B1 * | 8/2002 | Yamazaki | 315/169.3 |
| 6,518,700 B1 * | 2/2003 | Friend et al. | 313/504 |
| 6,674,237 B2 * | 1/2004 | Do et al. | 313/587 |

FOREIGN PATENT DOCUMENTS

| | | |
|---|---|---|
| JP | 7-161474 | 6/1995 |
| JP | 8-222368 | 8/1996 |
| JP | 9-274990 | 10/1997 |
| JP | 10-335060 | 12/1998 |
| KR | 1992-3811 | 2/1992 |

OTHER PUBLICATIONS

Notice to Submit Response for corresponding Korean Application No. 10-0085101 dated Feb. 24, 2004.

* cited by examiner

*Primary Examiner*—Ashok Patel
*Assistant Examiner*—Dalei Dong
(74) *Attorney, Agent, or Firm*—Staas & Halsey LLP

(57) ABSTRACT

An organic electroluminescent display (EL) device including a transparent substrate, a first electrode unit formed on the transparent substrate in a predetermined pattern and made of a transparent conductive material, an organic EL unit including organic layers having a predetermined pattern, stacked on the first electrode unit, a second electrode unit corresponding to the first electrode unit, formed on the organic EL unit in a predetermined pattern, and an encapsulation layer to encapsulate the first electrode unit, the organic EL unit and the second electrode unit to protect the same, the encapsulation layer including a first component and a second component made of one or more metals selected from the group consisting of iron (Fe), cobalt (Co), vanadium (V), titanium (Ti), aluminium (Al), silver (Ag) and platinum (Pt).

29 Claims, 8 Drawing Sheets

FIG. 15

ORGANIC ELECTROLUMINESCENT DISPLAY DEVICE

CROSS-REFERENCE TO RELATED APPLICATIONS

This application claims the benefit of Korean Patent Application No. 2001-85101 filed on Dec. 26, 2001, in the Korean Industrial Property Office, the disclosure of which is incorporated herein by reference.

BACKGROUND OF THE INVENTION

1. Field of the Invention

The present invention relates to an organic electroluminescent (EL) display device, and more particularly, to an organic electroluminescent display device having improved structures of electrodes and an encapsulation layer and an external light reflection prevention structure.

2. Description of the Related Art

Recently, much attention has been paid to electroluminescent display devices because they have advantageous features suitable for next generation display devices, such as a wide viewing angle, a high contrast ratio and a high response speed. Electroluminescent display devices are classified into inorganic electroluminescent display devices and organic electroluminescent display devices according to materials to form emitter layers.

At the beginning of the development of inorganic electroluminescent display devices, they were put into commercial use as green-emitting display devices. However, inorganic electroluminescent display devices, like plasma display devices, are driven under an AC bias condition and require drive of several hundreds of volts. Also, since light-emitting materials for the inorganic electroluminescent display devices are inorganic matter, it is difficult to control light emission wavelength characteristics through molecular design, so that full-color display of a picture is not easily achieved.

On the other hand, organic electroluminescent display devices are spontaneous emission display devices that emit light by electrically exciting fluorescent organic compounds. Thus, it is expected that organic electroluminescent display devices can be applied to next generation display devices that can overcome shortcomings of liquid crystal display devices, with characteristics including low driving voltage, enabling the production of thin, small display panels, wide viewing angle, high response speed and so on. Organic electroluminescent display devices using a layered structure have been developed by Eastman Kodak Company and have been commercialized as green-emitting display devices having improved lifetime by Pioneer Electronic Corporation.

Recently, many kinds of new materials having various molecular structures that are advantageous in organic materials, and organic electroluminescent display devices (to be abbreviated as organic EL devices, hereinafter) as color display devices having excellent characteristics including lower DC drive voltage, small and thin structure, spontaneous emission and so on, have been the subjects of active research.

Figure 1:
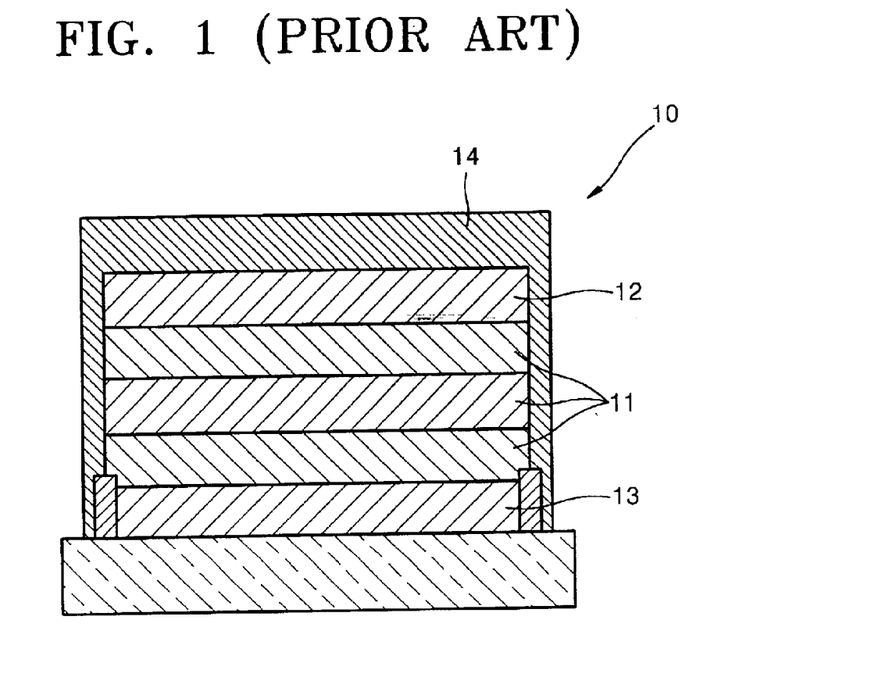
FIG. 1 is a cross-sectional view of a conventional organic EL device.

An example of an organic EL device is disclosed in Japanese Patent Publication No. Hei 10-335060 and is shown in FIG. 1.

Referring to FIG. 1, an organic EL device 10 is configured such that an organic layered structure 11 is disposed between an anode 12 and a cathode 13, and the cathode 13 is protected by an encapsulation layer 14 containing aluminum and at least one material having a work function greater than that of aluminum.

In the conventional organic EL device having the above-described configuration, external light is reflected by the cathode 13 and the encapsulation layer 14, degrading readability of an image. In particular, in an outdoor environment in which the organic EL device is exposed to sunlight, relative luminance and contrast are sharply degraded by external light reflected by the cathode 13.

U.S. Pat. No. 5,059,861 discloses an organic EL device having a cathode formed of various kinds of metals, excluding alkaline metals.

U.S. Pat. No. 5,047,687 discloses an organic EL device having a cathode formed of various kinds of metals including at least one metal having a low work function, excluding alkaline metals. Here, the metals include aluminum, vanadium and cobalt.

Japanese Patent Publication No. Hei 9-274990 discloses an organic EL device having an encapsulation layer that encapsulates an anode, an organic layered structure and a cathode, the encapsulation layer having at least one dehydrating agent selected from the group consisting of silica gel, zeolite, calcium chloride, activated carbon, nylon and polyvinyl alcohol.

U.S. Pat. No. 5,073,446, Japanese Patent Publication Nos. Hei 5-36475, Hei 8-222368 and Hei 7-161474 disclose organic EL devices having an anode, an organic layered structure, a cathode, an encapsulation layer to protect the cathode, and a sealing layer.

Most conventional EL devices use a polarizing film on the surface of a substrate in order to prevent reduction in the luminance of an image due to reflection of external light by electrodes and an organic layered structure. However, the use of a polarizing film results in shielding of some light generated from the organic layered structure, causing a substantial decrease in luminance.

SUMMARY OF THE INVENTION

Accordingly, it is an object of the present invention to provide an organic EL device which can enhance the contrast and luminance of an image and can remove the necessity of using a polarizing film to reduce the reflection of external light.

The foregoing and other objects of the present invention are achieved by providing an organic EL device comprising: a transparent substrate; a first electrode unit formed on the transparent substrate in a predetermined pattern and made of a transparent conductive material; an organic EL unit including organic layers having a predetermined pattern, stacked on the first electrode unit; a second electrode unit corresponding to the first electrode unit, formed on the organic EL unit in a predetermined pattern; and an encapsulation layer to encapsulate the first electrode unit, the organic EL unit and the second electrode unit to protect the same, the encapsulation layer consisting of a first component and a second component made of one or more metals selected from the group consisting of iron (Fe), cobalt (Co), vanadium (V), titanium (Ti), aluminium (Al), silver (Ag) and platinum (Pt).

In an embodiment of the present invention, the first component of the organic EL device is at least one transparent material selected from the group consisting of $SiO_x$ (x>1), $SiN_x$ (x>1), $MgF_2$, $CaF_2$, $Al_2O_3$, $In_2O_3$, and ITO (Indium Tin Oxide), and the encapsulation layer has a gradual component concentration gradient is distributed such that the light absorption efficiency of the encapsulation layer gradually increases along the thickness direction of the encapsulation layer as the distance of the encapsulation layer from the surface upon which external light is incident increases.

The foregoing and other objects of the present invention may also be achieved by providing an organic EL device comprising: a transparent substrate; a first electrode unit formed on the transparent substrate in a predetermined pattern and made of a transparent conductive material; an organic EL unit including organic layers having a predetermined pattern stacked on the first electrode unit; a second electrode unit formed on the organic EL unit consisting of a first component and a second component made of one or more metals selected from the group consisting of iron (Fe), cobalt (Co), vanadium (V), titanium (Ti), aluminium (Al), silver (Ag) and platinum (Pt); and an encapsulation layer to encapsulate the first electrode unit, the organic EL unit and the second electrode unit.

The foregoing and other objects of the present invention may also be achieved by providing an organic EL device comprising: a transparent substrate; an external light absorbing layer formed on the transparent substrate to absorb external light, a second electrode unit formed on the external light absorbing layer, an organic EL unit formed of organic layers having a predetermined pattern and stacked on the second electrode unit, and a first electrode unit formed on the organic EL unit in a predetermined pattern.

In an embodiment of the present invention, the external light absorbing layer includes a first component made of at least one transparent material selected from the group consisting of $SiO_x$ (x>1), $SiN_x$ (x>1), $MgF_2$, $CaF_2$, $Al_2O_3$, $In_2O_3$, and ITO (Indium Tin Oxide), and a second component made of one or more metals selected from the group consisting of iron (Fe), cobalt (Co), vanadium (V), titanium (Ti), aluminium (Al), silver (Ag) and platinum (Pt). Also, in an embodiment of the present invention, the external light absorbing layer is configured to have a gradual component concentration gradient.

The foregoing and other objects of the present invention may also be achieved by providing an organic EL device comprising: a substrate; a pixel area having anode layers formed on the substrate in a predetermined pattern; an organic EL unit having organic layers stacked on the respective anode layers; an insulating protective layer formed on the substrate to open the organic EL device, and cathode layers formed on the organic EL unit and protective layer in a predetermined pattern, and a drive area having thin film transistors (TFTs) formed on the substrate to selectively apply a predetermined voltage to the anode layers, wherein the anode layers are formed of external light absorbing layers.

The foregoing and other objects of the present invention may also be achieved by providing an organic EL device comprising: a transparent substrate, a buffer layer formed on the transparent substrate, a thin film transistor (TFT) layer formed on the buffer layer, an intermediate insulator layer to cover the TFT layer, a transparent electrode layer formed on the intermediate insulator layer in a predetermined pattern and to which voltages are selectively applied by TFTs, an insulating protective layer having an opening to open the transparent electrode layer, an organic EL unit having organic layers stacked on the transparent electrode layer, and a cathode layer formed on the organic EL unit and the insulating protective layer in a predetermined pattern, wherein an external light absorbing layer is formed between the intermediate insulator layer and the insulating protective layer, excluding an area corresponding to the organic EL unit.

The foregoing and other objects of the present invention may also be achieved by providing an organic EL device comprising: a transparent substrate; a buffer layer formed on the transparent substrate; a thin film transistor (TFT) layer formed on the buffer layer; an intermediate insulator layer to cover the TFT layer; a transparent electrode layer formed on the intermediate insulator layer in a predetermined pattern and to which voltages are selectively applied by TFTs; an insulating protective layer having an opening to open the transparent electrode layer; an organic EL unit having organic layers stacked on the transparent electrode layer; and a cathode layer formed on the organic EL unit and the insulating protective layer in a predetermined pattern, wherein the cathode layer includes a first component which is a transparent material and a second component made of one or more metals selected from the group consisting of iron (Fe), cobalt (Co), vanadium (V), titanium (Ti), aluminium (Al), silver (Ag) and platinum (Pt).

The foregoing and other objects of the present invention are also achieved by providing a method of preparing an organic EL device comprising: preparing a transparent substrate; forming a first electrode unit formed on the transparent substrate in a predetermined pattern; forming an organic EL unit including organic layers having a predetermined pattern, stacked on the first electrode unit; forming a second electrode unit formed on the organic EL unit to drive the organic EL unit with the first electrode unit; and forming an encapsulation layer to encapsulate the first electrode unit, the organic EL unit and the second electrode unit, the encapsulation layer including a first component formed of a transparent material and a second component formed of a metal, the first and second components having a gradual component concentration gradient.

In this embodiment, the forming of an encapsulation layer includes injecting a mixture of 3–50 wt % of SiO, which is a transparent material, and 50–97 wt % of at least one metal selected from the group consisting of Fe, Co, V, Ti, Al, Ag, Cu and Pt, the SiO and the metal having different melting points, into a deposition boat, and depositing SiO and the metal while gradually raising the temperature of the deposition boat to form the encapsulation layer.

BRIEF DESCRIPTION OF THE DRAWINGS

These and other objects and advantages of the present invention will become apparent and more readily appreciated from the following description of the embodiments, taken in conjunction with the accompanying drawings of which.

DETAILED DESCRIPTION OF THE PREFERRED EMBODIMENTS

Reference will now be made in detail to the embodiments of the present invention, examples of which are illustrated in the accompanying drawings, wherein like reference numerals refer to the like elements throughout. The embodiments are described below in order to explain the present invention by referring to the figures.

Figure 2:
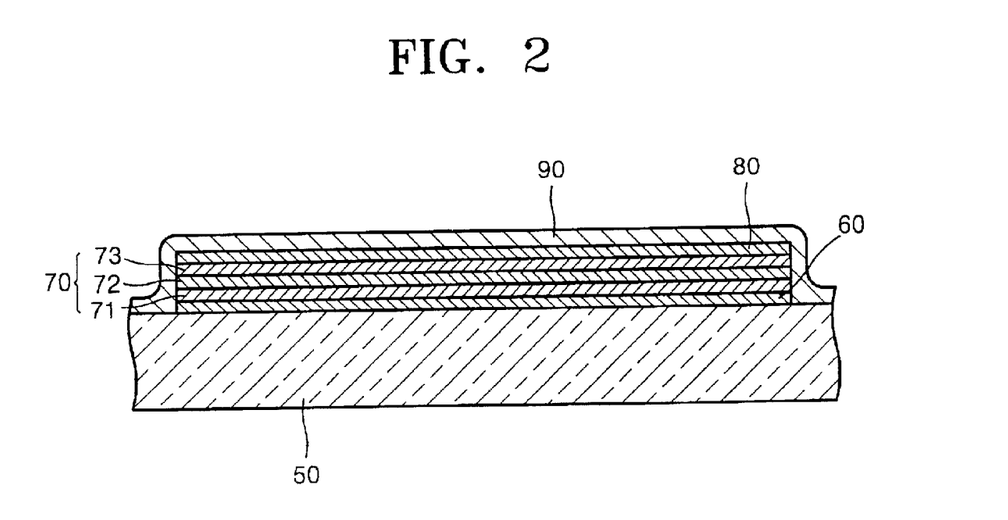
FIG. 2 is a cross-sectional view of an organic EL device according to an embodiment of the present invention.

An organic EL device according to the present invention is adapted to enhance the luminance of an image by allowing external light to be absorbed by an encapsulation layer or electrodes, as illustrated in FIG. 2.

Referring to FIG. 2, an organic EL device according to an embodiment of the present invention comprises a first electrode unit 60 formed on a transparent substrate 50 in a predetermined pattern, an organic EL unit 70 including organic layers formed on the first electrode unit 60, a second electrode unit 80 formed on the organic EL unit 70 in a predetermined pattern, and an encapsulation layer 90 formed on the transparent substrate 50 to encapsulate the first electrode unit, the organic EL unit 70 and the second electrode unit 80, the encapsulation layer 90 including a first component which is a transparent material and a second component made of one or more metals.

The first electrode unit 60 is an anode formed on the transparent substrate 50 and is made of ITO, which is a transparent conductive material. Although not shown in the figure, an embodiment of the present invention provides that the first electrode unit 60 consists of striped electrodes installed in parallel with one another.

The organic EL unit 70 includes a hole transport layer 71, an emitter layer 72 and an electron transport layer 73, sequentially stacked from the top surface of the first electrode unit 60. The organic EL unit 70 includes organic thin layers made of organic compounds. In particular, representative materials of the emitter layer 72 include small-molecule materials such as tris(8-hydroxyquinoline) aluminium ($Alq_3$), and polymers such as poly(para-phenylenevinylenes) or poly(2-methoxy-5(2'-ethylhexyloxy)-1,4-phenylenevinylenes.

The second electrode unit 80 is formed of a conductive metal, and an embodiment of the present invention provides that this second electrode unit 80 has a plurality of striped electrodes formed in a direction orthogonal with the first electrode unit 60.

The encapsulation layer 90, formed on the transparent substrate 50, encapsulates the first electrode unit 60, the organic EL unit 70 and the second electrode unit 80 and is configured to absorb incident external light.

Figure 3:
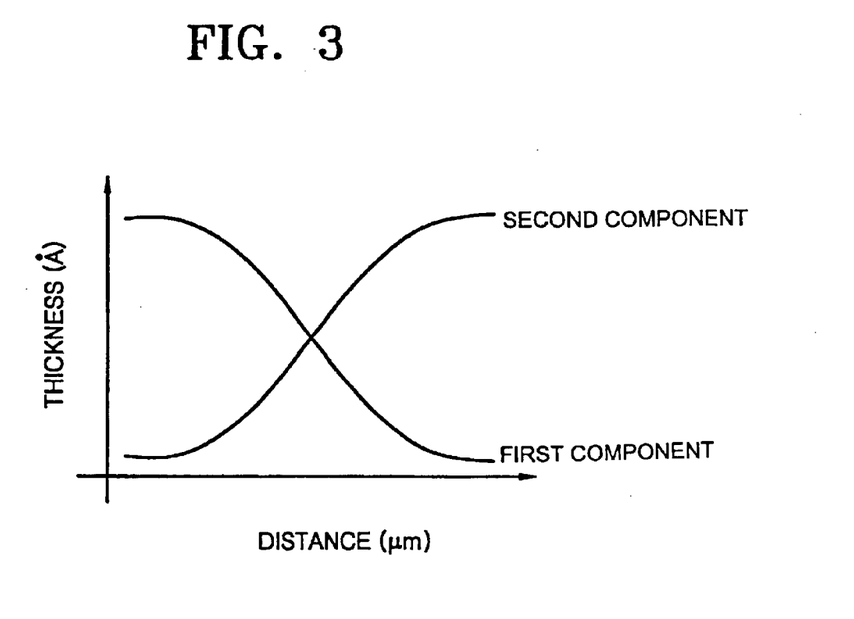
FIG. 3 is a graph illustrating a component concentration gradient according to the thickness direction of an encapsulation layer shown in FIG. 2.

In more detail, the encapsulation layer 90 includes of the first component, which is a transparent material, and the second component made of one or more metals selected from the group consisting of iron (Fe), cobalt (Co), vanadium (V), titanium (Ti), aluminium (Al), silver (Ag) and platinum (Pt). As illustrated in FIG. 3, the encapsulation layer 90 has a gradual component concentration gradient along a thickness direction. The first component includes one or more transparent materials selected from the group consisting of $SiO_x$ (x>1), $SiN_x$ (x>1), $MgF_2$, $CaF_2$, $Al_2O_3$, $In_2O_3$, and ITO (Indium Tin Oxide).

Figure 4:
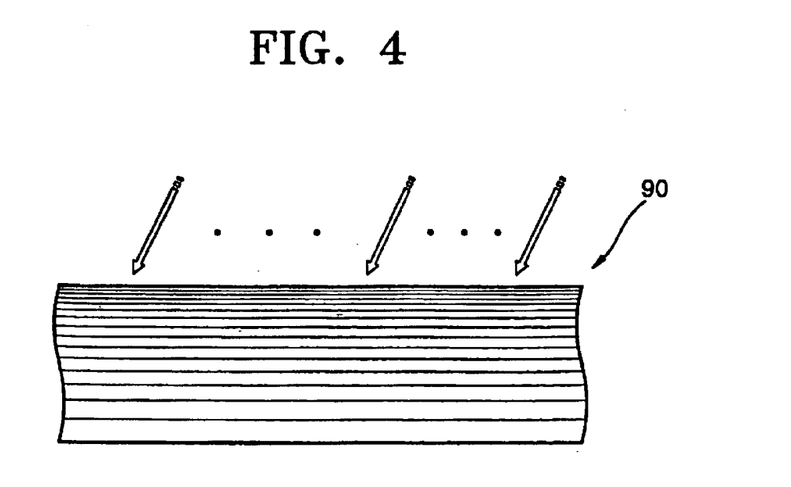
FIGS. 4 and 5 illustrate component concentration gradients.
Figure 5:
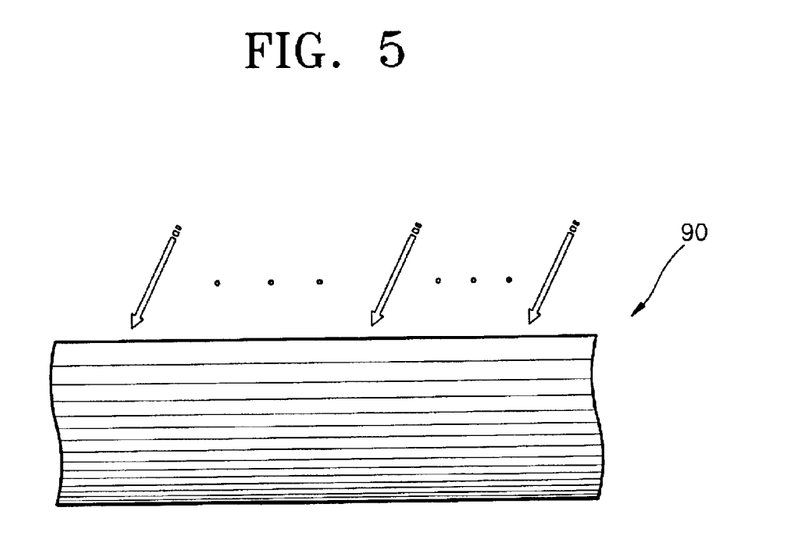

According to the gradual content grade of the encapsulation layer 90 along a thickness direction, as the distance from the surface upon which external light is incident increases, a light absorption efficiency of the encapsulation layer 90 gradually increases or decreases, as illustrated in FIGS. 4 and 5. Also, as the distance of the encapsulation layer 90 having the component concentration gradient from the surface upon which external light is incident increases, the content of the transparent material, i.e., the first component, gradually decreases and the content of the metal, that is, the second component, gradually increases.

Figure 6:
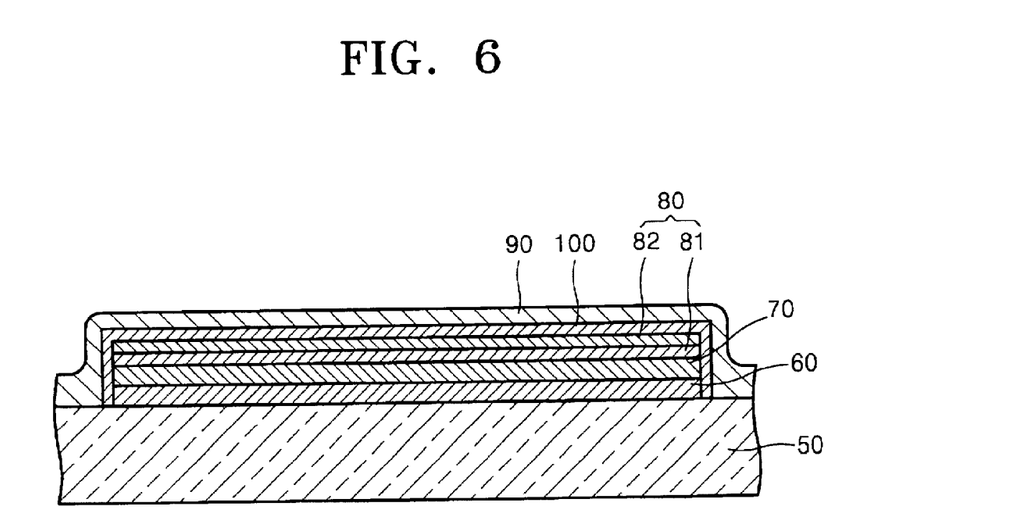
FIGS. 6 and 7 are cross-sectional views of organic EL devices according to two additional embodiments of the present invention.

An embodiment of the present invention provides that the second electrode unit 80 has a first electrode 81 made of Ca and a second electrode 82 made of ITO, which is a conductive transparent material, stacked on the first electrode 80, to have a sheet resistance of 1 $\Omega/\square$ or less, as illustrated in FIG. 6. In the case where the second electrode unit 80 includes ITO, the ITO content gradually decreases and the metal content gradually increases as the distance of the second electrode unit 80 from the surface upon which external light is incident increases. Also, an embodiment of the present invention provides that the encapsulation layer 90 further includes a protective layer 100 that encapsulates the first electrode unit 60, the organic EL unit 70 and the second electrode unit 80.

Figure 7:
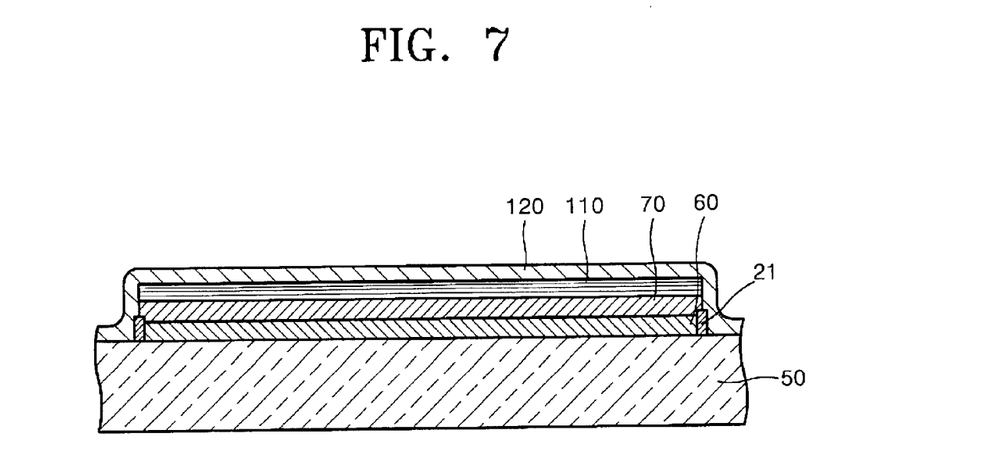

FIG. 7 is a cross-sectional view of an organic EL device according to another embodiment of the present invention. In this embodiment, the same reference numerals denote the same elements as in the embodiment shown in FIG. 6.

Figure 8:
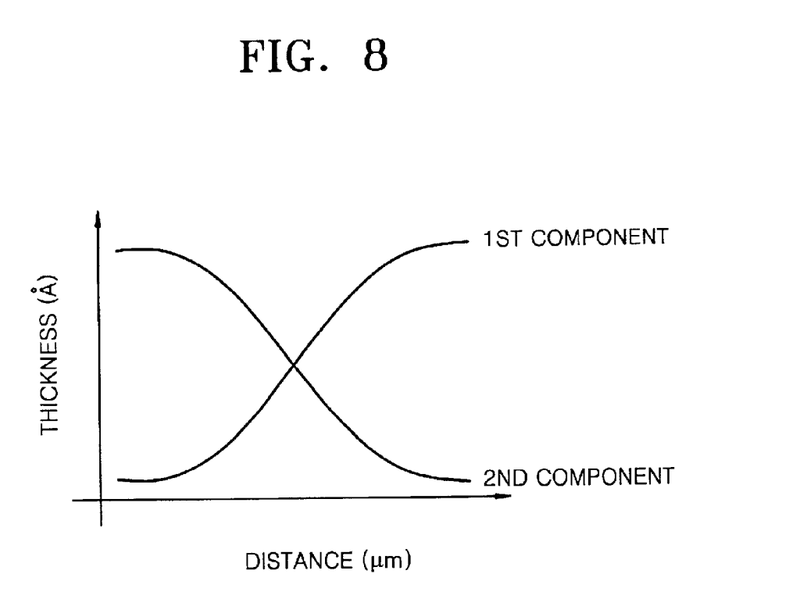
FIG. 8 is a graph illustrating a component concentration gradient according to the thickness direction of a second electrode unit illustrated in FIG. 6.

Referring to FIG. 7, a transparent substrate 50, a first electrode unit 60 made of a conductive material and having a predetermined pattern, and an organic EL unit 70 made of a plurality of organic layers, are stacked in sequence. A second electrode unit 110 is formed on the organic EL unit 70. The second electrode unit 110 includes a first component, which is a transparent material, and a second component made of one or more metals selected from the group consisting of iron (Fe), cobalt (Co), vanadium (V), titanium (Ti), aluminium (Al), silver (Ag) and platinum (Pt). The second electrode unit 110 has a gradual component concentration gradient along a thickness direction. According to the gradual content grade of the second electrode unit 110 along a thickness direction, as the distance from the surface upon which external light is incident increases, a light absorption efficiency of the second electrode unit 110 gradually increases. As shown in FIG. 8, as the second electrode unit 110 having the content grade from the surface upon which external light is incident increases, the content of the transparent material, i.e., the first component, gradually increases and the content of the metal, that is, the second component, gradually decreases.

Also, the first electrode unit 60, the organic EL unit 70 and the second electrode unit 110 are encapsulated by an encapsulation layer 120. The encapsulation layer 120 is made of aluminum or an aluminum alloy, and the first electrode unit 60 is insulated by the insulation layer 21 and the encapsulation layer 120.

Figure 9:
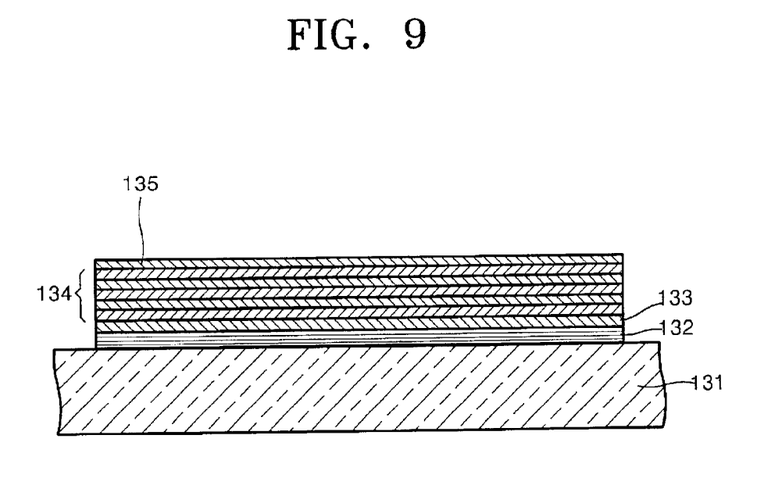
FIG. 9 is a cross-sectional view of an organic EL device according to still another embodiment of the present invention.

FIG. 9 is a cross-sectional view of an organic EL device according to another embodiment of the present invention.

Referring to FIG. 9, the organic EL device according to this embodiment comprises an external light absorbing layer 132 formed on a transparent substrate 131 to absorb external light, a second electrode unit 133 formed on the external light absorbing layer 132, an organic EL unit 134 formed of organic layers having a predetermined pattern, the organic layers being stacked on the second electrode unit 133, and a transparent first electrode unit 135 formed on the organic EL unit 134 in a predetermined pattern.

The external light absorbing layer 132 includes a first component including one or more transparent materials selected from the group consisting of $SiO_x$ (x>1), $SiN_x$ (x>1), $MgF_2$, $CaF_2$, $Al_2O_3$, $In_2O_3$, and ITO (Indium Tin Oxide), and a second component including one or more metals selected from the group consisting of iron (Fe), cobalt (Co), vanadium (V), titanium (Ti), aluminium (Al), silver (Ag) and platinum (Pt). Also, the external light absorbing layer 132 has a gradual component concentration gradient. As the distance of the external light absorbing layer 132 from the surface upon which external light is incident increases, the content of the dielectric material, i.e., the first component, gradually decreases and the content of the metal, that is, the second component, gradually increases.

Figure 10:
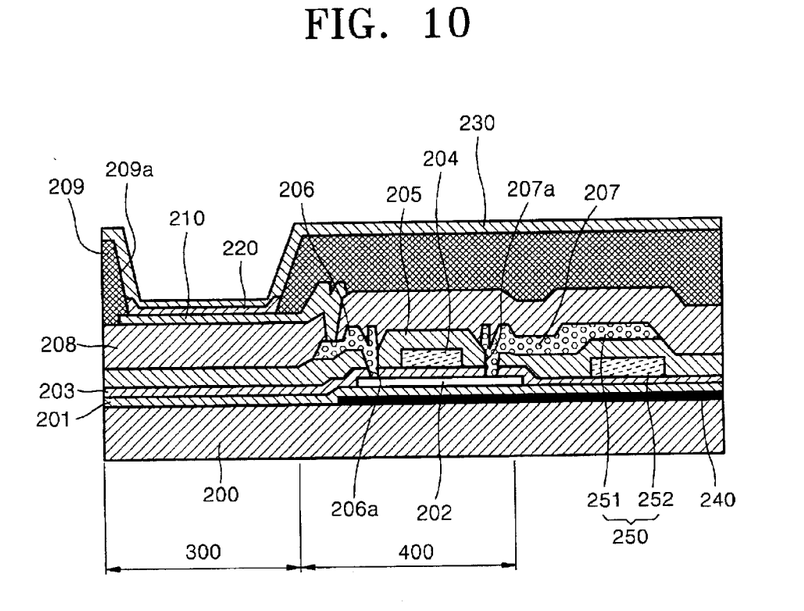
FIG. 10 is a cross-sectional views of an organic EL device according to still another embodiment of the present invention.
Figure 11:
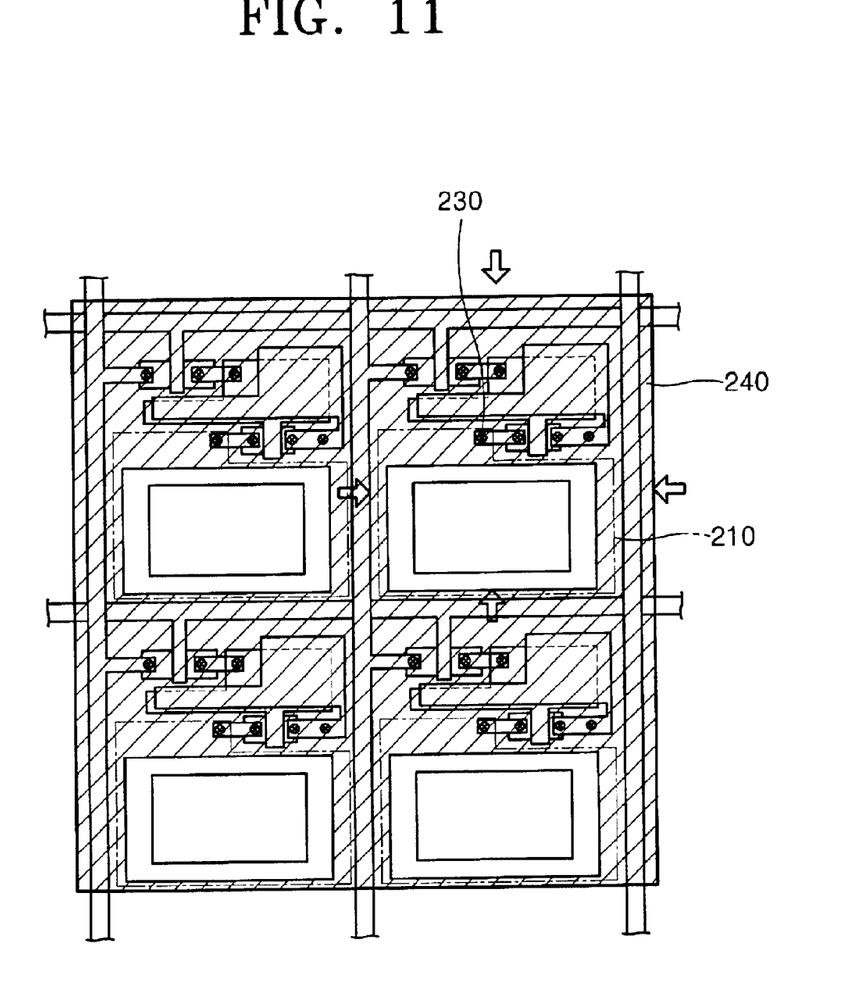
FIG. 11 illustrates an arrangement of the organic EL device illustrated in FIG. 10.

FIGS. 10 and 11 show an exemplary active matrix organic light emitting display (AMOLED) device.

As shown, the AMOLED device comprises a buffer layer 201 formed on a transparent substrate 200, a pixel area 300 having pixels and a transparent electrode 210 for pixel formation, the pixel area 300 formed on the buffer layer 201, and a drive area 400 having a thin film transistor (TFT) and a capacitor 250.

In the drive area 400, the TFT includes a p- or n-type semiconductor layer 202 arranged on the buffer layer 201 in a predetermined pattern, and covered by a gate insulation layer 203, a gate electrode layer 204 corresponding to the semiconductor layer 202, an intermediate insulator layer 205 to cover the gate electrode layer 204, and drain and source electrodes 206 and 207 connected to both sides of the semiconductor layer 202 via contact holes 206a and 207a formed through the intermediate insulator layer 205 and the gate insulation layer 203 and formed on the intermediate insulator layer 205. Also, the capacitor 250 includes a first electrode 251 connected with the source electrode 207 and formed on the intermediate insulator layer 205, and a second electrode 252 opposed to the first electrode 251 and covered by the intermediate insulator layer 205.

A protective layer 208 to protect the intermediate insulator layer 205, and a planarization layer 209 having an opening 209a formed in the pixel area 300, are provided. A transparent electrode 210 electrically connected to the drain electrode 206 is formed on the bottom of the opening 209a of the planarization layer 209. An organic layer 220 is formed on the transparent electrode 210, and a cathode layer 230 is formed on the organic layer 220 and planarization layer 209.

An external light absorbing layer 240 is formed between the substrate 200 and the buffer layer 201 corresponding to the pixel area 300, that is, under the TFT and the capacitor 250 constituting the drive area 400. The external light absorbing layer 240 includes a first component made of one or more transparent materials selected from the group consisting of $SiO_x$ (x>1), $SiN_x$ (x>1), $MgF_2$, $CaF_2$, $Al_2O_3$, $In_2O_3$, and ITO (Indium Tin Oxide) and a second component made of one or more metals selected from the group consisting of iron (Fe), cobalt (Co), vanadium (V), titanium (Ti), aluminium (Al), silver (Ag) and platinum (Pt), and has a gradual component concentration gradient along a thickness direction. Preferably, as the distance of the external light absorbing layer 240 from the surface upon which external light is incident increases, the content of the transparent material, i.e., the first component, gradually decreases and the content of the metal, that is, the second component, gradually increases.

Figure 12:
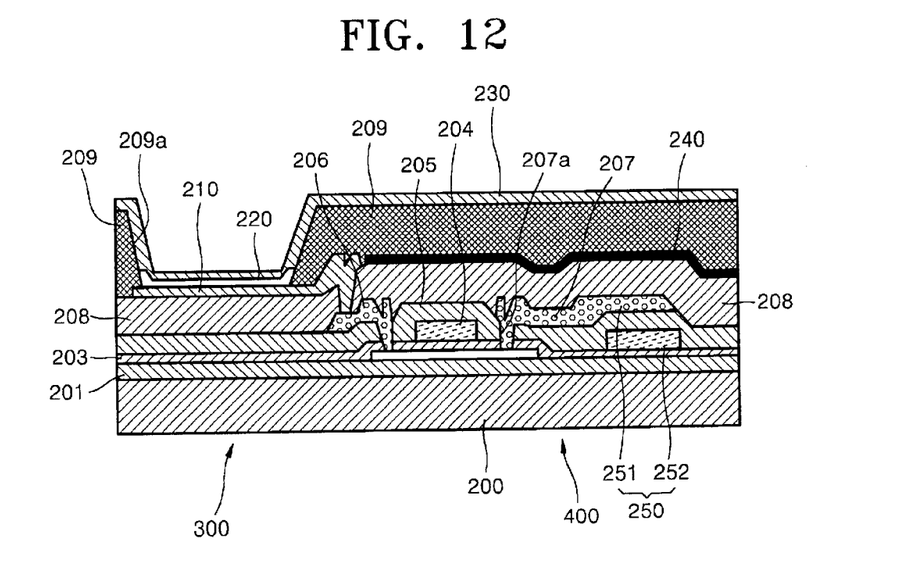
FIGS. 12 through 15 are cross-sectional views of organic EL devices according to still four additional embodiments of the present invention.
Figure 13:
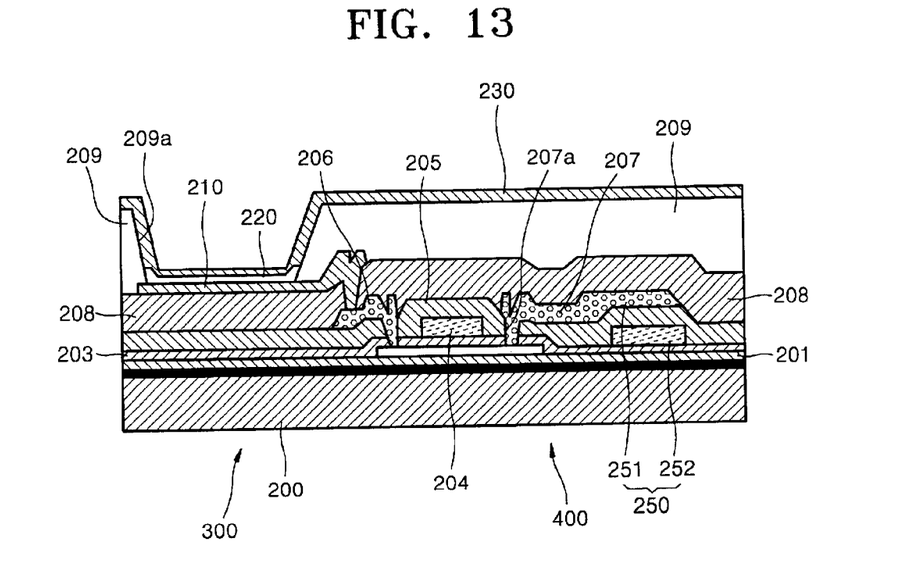

As illustrated in FIG. 11, the external light absorbing layer 240 may be formed on an area other than the pixel area 300. That is to say, the external light absorbing layer 240 may be formed between the protective layer 208 and the planarization layer 209, that is, in an area corresponding to the pixel area 300, as illustrated in FIG. 12, in a front-surface emission type organic EL device. Also, as illustrated in FIG. 13, a front-surface emission type organic EL device may be formed over the entire surface between the substrate 200 and the buffer layer 201.

Figure 14:
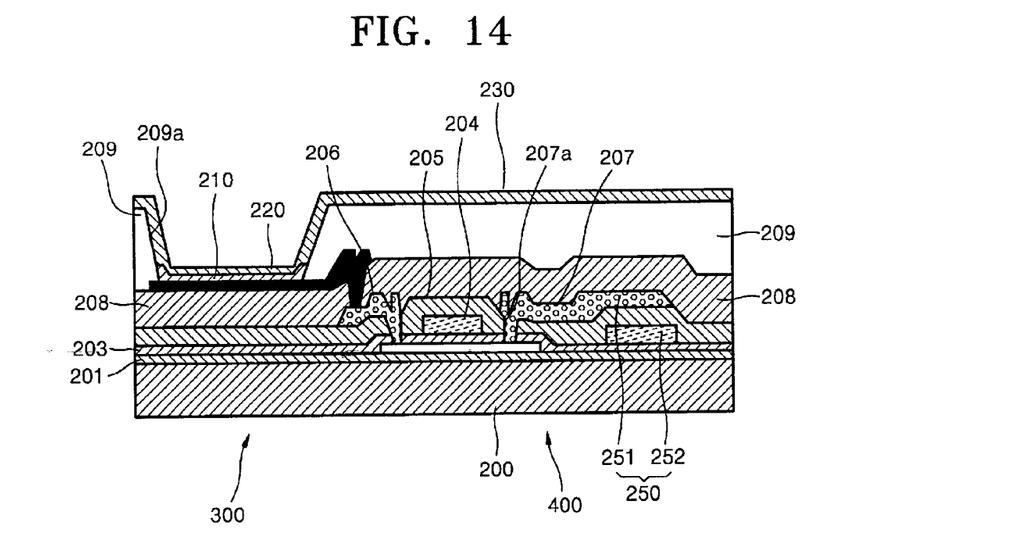

FIG. 14 illustrates another example of a front-surface emission type organic EL device according to the present invention.

Referring to FIG. 14, a transparent electrode 210, which is an anode layer of an area for pixel formation, includes a first component made of ITO, and a second component. Here, the transparent electrode 210 is configured such that the content of the second component is relatively higher at a substrate side and the content of the first component is relatively higher at an organic emission layer side.

Figure 15:
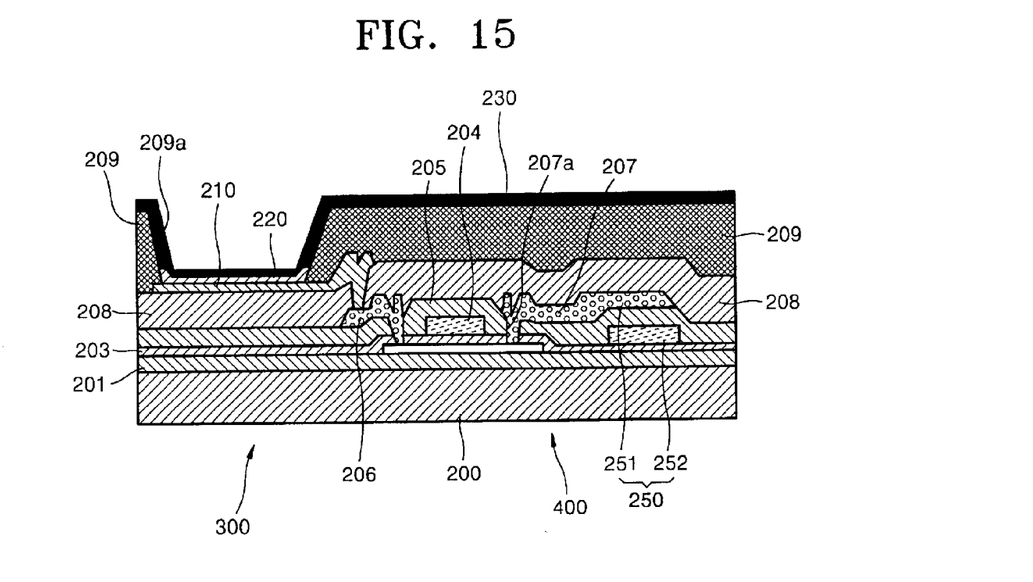

According to still another embodiment of the present invention, as illustrated in FIG. 15, in the case of a rear-surface emission type organic EL device, the cathode layer 230 includes a first component and a second component and has a component concentration gradient.

Referring back to FIG. 2, in the organic EL device having the above-described configuration, if a predetermined voltage is applied to the first electrode unit 60 and the second electrode unit 80, holes injected from the first electrode 60, that is, the anode, move to the emitter layer 72 via the hole transport layer 71, and electrons from the second electrode unit 80 are injected into the emitter layer 72 via the electron transport layer 73. The electrons and holes are recombined at the emitter layer 72 to generate excitons, and the generated excitons de-excite from an excited state to a base state so that fluorescent molecules of the emitter layer 72 emit light, thereby forming an image.

Since the organic EL device driven as described above is configured such that the encapsulation layer 90 or the second electrode unit 80 includes a transparent material and a metal to absorb incident external light, the luminance and contrast of the image formed by the organic EL unit 70 can be prevented from decreasing by reducing the reflection of incident external light.

These operations and effects will become more apparent by considering experiments to evaluate the luminance of the organic EL device according to Examples and a Comparative Example.

EXAMPLE 1

A first electrode unit made of ITO was formed on a transparent substrate, a hole injection layer made of copper phthalocyanine (CuPc) was deposited on the first electrode unit at 400° C. to a thickness of 200 Å, and a hole transport layer made of N,N'-di(naphthalene-1-yl)-N,N'-diphenyl-benzidine (NPB) was deposited on the hole injection layer at 300° C. to a thickness of 500 Å. Then, tris-8-hydroxyquinoline aluminum ($Alq_3$), lithium fluoride (LiF) and calcium (Ca) were deposited on the hole transport layer to thicknesses of 400 Å, 10 Å and 2000 Å, respectively, and an encapsulation layer was formed thereon to a thickness of 1000 Å such that a first component, e.g., SiO, and a second component, e.g., Ti, have a component concentration gradient.

The reflectivity of the organic EL device fabricated in the above-described manner, was less than 10%, as shown in Table 1. Even when the light intensity is 50 cd/m², the contrast of a formed image is 100:1, ensuring good optical characteristics.

EXAMPLE 2

A patterned black matrix was fabricated in the same manner as in Example 1, except that a transparent conductive material, e.g., ITO, was deposited on a Ca electrode to form a second electrode unit having a sheet resistance of 1 Ω/□ or less.

The reflectivity of the thus-fabricated organic EL device could be reduced to less than 10%, as illustrated in Table 1.

EXAMPLE 3

A patterned black matrix was fabricated in the same manner as in Example 1, except that a second electrode unit was formed using ITO and an encapsulation layer was formed using ITO-metal (e.g., Ti).

The reflectivity of the thus-fabricated organic EL device could be reduced to less than 20%, as illustrated in Table 1.

EXAMPLE 4

A patterned black matrix was fabricated in the same manner as in Example 1, except that a second electrode unit was formed using ITO and a protective layer to protect a first electrode unit, an organic EL unit and the second electrode unit from moisture, was formed on the inner surface of an encapsulation layer.

The reflectivity of the thus-fabricated organic EL device was reduced to less than 10% and the luminance thereof was enhanced by over 50% compared to an organic EL device according to a Comparative Example to be described later, as illustrated in Table 1.

EXAMPLE 5

A light absorbing layer including a first component, SiO, which is a dielectric layer, and a second component, Ti, which is a metal, was formed to a thickness of 1000 Å to have a component concentration gradient, a first electrode unit made of ITO was formed on the transparent substrate, a hole injection layer made of CuPc was deposited on the first electrode unit at 400° C. to a thickness of 200 Å, and a hole transport layer made of NPB was deposited on the hole injection layer at 300° C. to a thickness of 500 Å. Then, $Alq_3$, LiF and Ca were deposited on the hole transport layer to thicknesses of 400 Å, 10 Å and 2000 Å, respectively.

The reflectivity of the organic EL device fabricated in the above-described manner, was less than 10%, and the luminance thereof was enhanced by over 70% compared to an organic EL device according to the Comparative Example to be described later, as illustrated in Table 1.

EXAMPLE 6

In a rear-surface emission type AMOLED device using a TFT, an external light absorbing layer including a first component, e.g., SiO, which is a transparent material, and a second component, e.g., Ti, was formed between a substrate and a buffer layer, corresponding to the pixel area 300 having a TFT and a capacitor, to have a component concentration gradient.

The reflectivity of the thus-fabricated organic EL device could be reduced to less than 10%, and the luminance thereof was enhanced by over 200% compared to an organic EL device according to the Comparative Example to be described next, as illustrated in Table 1.

COMPARATIVE EXAMPLE

A first electrode unit made of ITO was formed on a transparent substrate, a hole injection layer made of CuPc was deposited on the first electrode unit at 400° C. to a thickness of 200 Å, and a hole transport layer made of NPB was deposited on the hole injection layer at 300° C. to a thickness of 500 Å. Then, $Alq_3$, LiF and Ca were deposited on the hole transport layer to thicknesses of 400 Å, 10 Å and 2000 Å, respectively, followed by hermetically sealing using an encapsulating material.

The reflectivity of the organic EL device fabricated in the above-described manner, was greater than 90%. Also, when the fabricated organic EL device was driven with a light intensity of 100 cd/m² and the intensity of external light was 50 cd/m², the contrast was noticeably reduced, that is, approximately 2:1, resulting in a considerable reduction in readability.

The experimental results of Examples 1–6 and the Comparative Example are illustrated in Table 1.

TABLE 1

| | Composition (wt %) | Luminance | Reflected light | Cathode resistance | Lifetime | Components of encapsulation layer or electrode |
|---|---|---|---|---|---|---|
| Comparative Example | With polarizing film | 100 | 10% | Less than 100 Ω/□ | 100% | |
| | Without polarizing film | 200 | 100% | Less than 100 Ω/□ | 100% | |
| Example 1 | | 150 | 10% | Less than 100 Ω/□ | 150% | SiO—Ti |
| Example 2 | | 150 | 10% | Less than 100 Ω/□ | 150% | SiO—Ti |
| Example 3 | | 150 | 20% | Less than 100 Ω/□ | 120% | ITO—Ti |

TABLE 1-continued

| | Composition (wt %) | Luminance | Reflected light | Cathode resistance | Lifetime | Components of encapsulation layer or electrode |
|---|---|---|---|---|---|---|
| Example 4 | | 150 | 10% | Less than 100 Ω/□ | 200% | $SiO_x$—$SiN_x$—Ti |
| Example 5 | | 170 | 10% | Less than 100 Ω/□ | | SiO—Ti |
| Example 6 | | 200 | 10% | Less than 100 Ω/□ | | SiO—Ti |

The encapsulation layer, third electrode layer or external light absorbing layer of the above-described organic EL device which absorbs external light can be fabricated by the following process.

First, a first electrode unit, an organic EL unit and a second electrode unit are sequentially formed on a substrate and the substrate is then fixed to be disposed opposite to a deposition boat in a vacuum deposition device. A mixture of a metal and a transparent material having different melting points, that is, a mixture containing a first and a second component, is injected into the deposition boat. Here, the mixture of a metal and a transparent material comprises 50–97 wt % of the second component, that is, at least one metal selected from the group consisting of Fe, Co, V, Ti, Al, Ag, Cu and Pt, and 3–50 wt % of the first component, that is, at least one transparent material selected from the group consisting of $SiO_x$ (x>1), $SiN_x$ (x>1), $MgF_2$, $CaF_2$, $Al_2O_3$, $In_2O_3$, and ITO (Indium Tin Oxide).

Then, while varying the temperature of the deposition boat containing the mixture of a metal and a transparent material, vacuum thermal deposition is performed. In order to vary the temperature of the deposition boat, a voltage applied to the deposition boat is slowly increased.

If the deposition temperature is slowly raised over time, the transparent material SiO first begins to be deposited, both the dielectric component and the metal component are simultaneously deposited at higher deposition temperature, and only the metal component is finally deposited, without any of the dielectric component remaining in the mixture, at a highest deposition temperature. As the result, as illustrated in FIG. 3, it is possible to form the encapsulation layer having the dielectric component, e.g., SiO, distributed such that its content gradually decreases and the metal component distributed such that its content gradually increases, as they are farther from the surface upon which external light is incident.

Alternatively, the encapsulation layer or electrode layer can be formed as follows.

First, a first electrode unit, an organic EL device and a second electrode unit are sequentially formed on a substrate, and the substrate is then fixed to be disposed opposite to a deposition boat in a vacuum deposition device. Sputtering is performed using a dielectric material target and a target having at least one metal selected from the group consisting of Fe, Co, V, Ti, Al, Ag, Cu and Pt, thereby forming the encapsulation layer.

As described above, according to the organic EL device of the present invention and the preparation method thereof, the contrast and luminance of an image can be enhanced by greatly reducing the reflection of external light. In particular, a polarizing film to shield external light can be removed, thereby promoting manufacturability.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. An organic electroluminescent display (EL) device comprising:
    a transparent substrate;
    a first electrode unit formed on the transparent substrate in a predetermined pattern and made of a transparent conductive material;
    an organic EL unit including organic layers having a predetermined pattern, stacked on the first electrode unit;
    a second electrode unit corresponding to the first electrode unit, formed on the organic EL unit in a predetermined pattern; and
    an encapsulation layer to absorb light and encapsulate the first electrode unit, the organic EL unit and the second electrode unit to protect the same, the encapsulation layer including a first component and a second component made of one or more metals selected from the group consisting of iron (Fe), cobalt (Co), vanadium (V), titanium (Ti), aluminium (Al), silver (Ag) and platinum (Pt),
    wherein the encapsulation layer has a gradual component concentration gradient in the direction of a thickness thereof.

2. The organic EL device according to claim 1, wherein the first component is at least one transparent material selected from the group consisting of $SiO_x$ (x>1), $SiN_x$ (x>1), $MgF_2$, $CaF_2$, $Al_2O_3$, $In_2O_3$, and ITO (Indium Tin Oxide).

3. The organic EL device according to claim 1, wherein the gradual component concentration gradient is distributed such that the light absorption efficiency of the encapsulation layer gradually increases along the thickness direction of the encapsulation layer as the distance of the encapsulation layer from the surface upon which external light is incident increases.

4. The organic EL device according to claim 3, wherein the gradual component concentration gradient is distributed such that the content of the transparent material gradually decreases in the same direction in which the content of the metal gradually increases.

5. The organic EL device according to claim 1, further comprising a protective layer to protect the first electrode unit, the organic EL unit and the second electrode unit, formed on the inner surface of the encapsulation layer.

6. An organic EL device comprising:

a transparent substrate;

a first electrode unit formed on the transparent substrate in a predetermined pattern and made of a transparent conductive material;

an organic EL unit having organic layers having a predetermined pattern stacked on the first electrode unit;

a second electrode unit absorbing light and formed on the organic EL unit, the second electrode unit having a first component made of a transparent material and a second component made of one or more metals selected from the group consisting of iron (Fe), cobalt (Co), vanadium (V), titanium (Ti), aluminium (Al), silver (Ag) and platinum (Pt); and an encapsulation layer to encapsulate the first electrode unit, the organic EL unit and the second electrode unit, wherein the second electrode unit has a gradual component concentration gradient in the direction of a thickness thereof.

7. The organic EL device according to claim 6, wherein the gradual component concentration gradient is distributed such that the light absorption efficiency of the encapsulation layer gradually increases along the thickness direction of the encapsulation layer as the distance of the encapsulation layer from the surface upon which external light is incident increases.

8. The organic EL device according to claim 6, wherein the gradual component concentration gradient is distributed such that the content of the transparent material gradually decreases in the same direction in which the content of the metal gradually increases.

9. The organic EL device according to claim 6, wherein the encapsulation layer is made of aluminum and aluminum alloys and further includes an insulation layer to insulate the encapsulation layer from the first electrode layer.

10. An organic EL device comprising:

a transparent substrate;

an external light absorbing layer formed on the transparent substrate to absorb external light;

a second electrode unit formed on the external light absorbing layer;

an organic EL unit formed of organic layers having a predetermined pattern and stacked on the second electrode unit; and a first electrode unit formed on the organic EL unit in a predetermined pattern, wherein the external light absorbing layer is configured to have a gradual component concentration gradient.

11. The organic EL device according to claim 10, wherein the external light absorbing layer includes a first component made of at least one transparent material selected from the group consisting of $SiO_x$ (x>1), $SiN_x$ (x>1), $MgF_2$, $CaF_2$, $Al_2O_3$, $In_2O_3$, and ITO (Indium Tin Oxide), and a second component made of one or more metals selected from the group consisting of iron (Fe), cobalt (Co), vanadium (V), titanium (Ti), aluminium (Al), silver (Ag) and platinum (Pt).

12. The organic EL device according to claim 11, wherein the external light absorbing layer has a gradual component concentration gradient in the direction its thickness.

13. The organic EL device according to claim 11, wherein the gradual component concentration gradient is distributed such that the content of the transparent material gradually increases and the content of the metal gradually decreases as the distance of the external light absorbing layer from the surface upon which external light is incident increases.

14. An organic EL device comprising:

a substrate;

a pixel area having anode layers formed on the substrate in a predetermined pattern, an organic EL unit having organic layers stacked on the respective anode layers, an insulating protective layer formed on the substrate to open the organic EL device, and cathode layers formed on the organic EL unit and protective layer in a predetermined pattern;

a drive area having thin film transistors (TFTs) formed on the substrate to selectively apply a predetermined voltage to the anode layers; and an external light absorbing layer formed on the substrate to be insulated from the anode layers, wherein the external light absorbing layer is configured to have a gradual component concentration gradient.

15. The organic EL device according to claim 14, wherein the external light absorbing layer comprises a first component made of at least one transparent material selected from the group consisting of $SiO_x$ (x>1), $SiN_x$ (x>1), $MgF_2$, $CaF_2$, $Al_2O_3$, $In_2O_3$, and ITO (Indium Tin Oxide), and a second component made of one or more metals selected from the group consisting of iron (Fe), cobalt (Co), vanadium (V), titanium (Ti), aluminium (Al), silver (Ag) and platinum (Pt).

16. The organic EL device according to claim 14, further comprising a buffer layer formed on the external light absorbing layer.

17. The organic EL device according to claim 14, wherein the anode layers and the cathode layers are transparent.

18. The organic EL device according to claim 14, wherein the external light absorbing layer is formed on the entire surface of the substrate.

19. The organic EL device according to claim 14, wherein the external light absorbing layer is formed on the entire surface of the substrate, excluding the pixel area.

20. An organic EL device comprising:

a substrate;

a pixel area having anode layers formed on the substrate in a predetermined pattern, an organic EL unit having organic layers stacked on the respective anode layers, an insulating protective layer formed on the substrate to open the organic EL device, and cathode layers formed on the organic EL unit and protective layer in a predetermined pattern; and a drive area having thin film transistors (TFTs) formed on the substrate to selectively apply a predetermined voltage to the anode layers, wherein the anode layers are formed of external light absorbing layers, and the cathode layer has a gradual component concentration gradient in the direction of a thickness thereof.

21. The organic EL device according to claim 20, wherein each of the external light absorbing layers forming the anode layers includes a first component made of at least one transparent material selected from the group consisting of $SiO_x$ (x>1), $SiN_x$ (x>1), $MgF_2$, $CaF_2$, $Al_2O_3$, $In_2O_3$, and ITO (Indium Tin Oxide), and a second component made of one or more metals selected from the group consisting of iron (Fe), cobalt (Co), vanadium (V), titanium (Ti), aluminium (Al), silver (Ag) and platinum (Pt).

22. An organic EL device comprising:

a transparent substrate;

a buffer layer formed on the transparent substrate;

a thin film transistor (TFT) layer formed on the buffer layer;

an intermediate insulator layer to cover the TFT layer;

a transparent electrode layer formed on the intermediate insulator layer in a predetermined pattern and to which voltages are selectively applied by TFTs;

an insulating protective layer having an opening to expose the transparent electrode layer;

an organic EL unit having organic layers stacked on the transparent electrode layer; and a cathode layer formed on the organic EL unit and the insulating protective layer in a predetermined pattern;

wherein an external light absorbing layer is formed between the intermediate insulator layer and the insulating protective layer, excluding an area corresponding to the organic EL unit, and wherein the external light absorbing layer has a gradual component concentration gradient in the direction of a thickness thereof.

23. The organic EL device according to claim 22, wherein the external light absorbing layer includes a first component made of at least one transparent material selected from the group consisting of $SiO_x$ (x>1), $SiN_x$ (x>1), $MgF_2$, $CaF_2$, $Al_2O_3$, $In_2O_3$, and ITO (Indium Tin Oxide), and a second component made of one or more metals selected from the group consisting of iron (Fe), cobalt (Co), vanadium (V), titanium (Ti), aluminium (Al), silver (Ag) and platinum (Pt).

24. An organic EL device comprising:

a transparent substrate:

a buffer layer formed on the transparent substrate;

a thin film transistor (TFT) layer formed on the buffer layer;

an intermediate insulator layer to cover the TFT layer;

a transparent electrode layer formed on the intermediate insulator layer in a predetermined pattern and to which voltages are selectively applied by TFTs;

an insulating protective layer having an opening to expose the transparent electrode layer;

an organic EL unit having organic layers stacked on the transparent electrode layer; and a cathode layer formed on the organic EL unit and the insulating protective aver in a predetermined pattern;

wherein the cathode layer includes a first component which is a transparent material and a second component made of one or more metals selected from the group consisting of iron (Fe), cobalt (Co), vanadium (V), titanium (Ti), aluminium (Al), silver (Ag) and platinum (Pt), wherein the cathode layer has a gradual component concentration gradient in the direction of a thickness thereof.

25. A method of preparing an organic EL device comprising:

preparing a transparent substrate;

forming a first electrode unit formed on the transparent substrate in a predetermined pattern;

forming an organic EL unit including organic layers having a predetermined pattern, stacked on the first electrode unit;

forming a second electrode unit formed on the organic EL unit to drive the organic EL unit with the first electrode unit; and forming an encapsulation layer to encapsulate the first electrode unit, the organic EL unit and the second electrode unit, the encapsulation layer including a first component formed of a transparent material and a second component formed of a metal, the first and second components having a gradual component concentration gradient.

26. The method according to claim 25, wherein the forming of an encapsulation layer comprises:

injecting a mixture of 3–50 wt % of SiO, which is a transparent material, and 50–97 wt % of at least one metal selected from the group consisting of Fe, Co, V, Ti, Al, Ag, Cu and Pt, the SiO and the metal having different melting points, into a deposition boat; and depositing SiO and the metal while gradually raising the temperature of the deposition boat to form the encapsulation layer.

27. The method according to claim 25, wherein the forming of an encapsulation layer comprises forming the encapsulation layer by performing sputtering using a transparent material target and a target having at least one metal selected from the group consisting of Fe, Go, V, Ti, Al, Ag, Cu and Pt, thereby forming the encapsulation layer.

28. An organic electroluminescent display (EL) device comprising:

a transparent substrate;

a first electrode unit formed on the transparent substrate in a predetermined pattern and made of a transparent conductive material;

an organic EL unit including organic layers having a predetermined pattern stacked on the first electrode unit;

a second electrode unit corresponding to the first electrode unit formed on the organic EL unit in a predetermined pattern; and an encapsulation layer to encapsulate the first electrode unit, the organic EL unit and the second electrode unit to protect the same, the encapsulation layer having a component concentration gradient in a direction of a thickness thereof.

29. An organic EL device comprising:

a transparent substrate;

a buffer layer formed on the transparent substrate;

a thin film transistor (TFT) layer formed on the buffer layer;

an intermediate insulator layer to cover the TFT layer;

a transparent electrode layer formed on the intermediate insulator layer in a predetermined pattern and to which voltages are selectively applied by TFTs;

an insulating protective layer having an opening to expose the transparent electrode layer;

an organic EL unit having organic layers stacked on the transparent electrode layer; and a cathode layer formed on the organic EL unit and the insulating protective layer in a predetermined pattern;

wherein the cathode layer has a component concentration gradient in a direction of a thickness thereof.

* * * * *

UNITED STATES PATENT AND TRADEMARK OFFICE
CERTIFICATE OF CORRECTION

PATENT NO. : 6,815,887 B2
DATED : November 9, 2004
INVENTOR(S) : Joon-bae Lee et al.

It is certified that error appears in the above-identified patent and that said Letters Patent is hereby corrected as shown below:

<u>Column 16,</u>
Line 22, change "Go" to -- Co --.

Signed and Sealed this

Twenty-sixth Day of April, 2005

JON W. DUDAS
*Director of the United States Patent and Trademark Office*